United States Patent [19]

Bindra et al.

[11] Patent Number: 5,048,178

[45] Date of Patent: Sep. 17, 1991

[54] ALIGNMENT—REGISTRATION TOOL FOR FABRICATING MULTI-LAYER ELECTRONIC PACKAGES

[75] Inventors: Perminder S. Bindra, South Salem, N.Y.; Peter J. Lueck, Leonberg, Fed. Rep. of Germany; Eberhard H. Naegele, Johnson City, N.Y.

[73] Assignee: International Business Machines Corp., Armonk, N.Y.

[21] Appl. No.: 602,554

[22] Filed: Oct. 23, 1990

[51] Int. Cl.$^5$ .................. H05K 3/36; B23P 21/00
[52] U.S. Cl. .................................. 29/830; 29/720; 29/721; 29/833; 29/839; 156/64; 264/61; 361/412; 428/901
[58] Field of Search .............. 29/830, 833, 834, 720, 29/721, 759, 760; 361/414, 412; 156/64; 264/61; 414/792.7; 428/901

[56] References Cited

U.S. PATENT DOCUMENTS

| | | | |
|---|---|---|---|
| 4,203,132 | 5/1980 | Schmitt et al. | 358/101 |
| 4,404,741 | 9/1983 | Lebet et al. | 29/721 |
| 4,463,673 | 8/1984 | Moore | 29/720X |
| 4,481,533 | 11/1984 | Alzmann et al. | 358/101 |
| 4,494,139 | 1/1985 | Shima et al. | 358/101 |
| 4,536,239 | 8/1985 | Benson | 156/64 |
| 4,568,971 | 2/1986 | Alzmann et al. | 358/101 |
| 4,655,600 | 4/1987 | Tanigawa | 356/401 |
| 4,663,658 | 5/1987 | Lanne et al. | 358/101 |
| 4,680,627 | 7/1987 | Sase et al. | 358/101 |
| 4,731,923 | 3/1988 | Yagi et al. | 29/833 |
| 4,738,025 | 4/1988 | Arnold | 29/834 |
| 4,829,375 | 5/1989 | Alzmann et al | 358/101 |
| 4,914,829 | 4/1990 | Keaton | 29/830 |
| 4,980,971 | 1/1991 | Bartschat et al | 29/720 X |

FOREIGN PATENT DOCUMENTS

| | | | |
|---|---|---|---|
| 2917472 | 11/1980 | Fed. Rep. of Germany | 29/830 |
| 1066052 | 1/1984 | U.S.S.R. | 29/833 |

OTHER PUBLICATIONS

IBM Tech. Disclosure Bull., vol. 26, No. 7A, Dec. 1983, p. 3153 by F. E. Grospin et al.

*Primary Examiner*—Carl J. Arbes
*Attorney, Agent, or Firm*—Richard M. Goldman

[57] ABSTRACT

Disclosed is a method of forming a multilayer microelectronic circuit package. According to the disclosed method, the first layer of the package has features that are brought into proximity to an optical system which is adapted for imaging a surface of the layer. The optical system images features on the surface of the first layer, and generates targets around selected ones of the features. The next layer of the circuit package is brought into proximity to the optical system. This next layer is moved, i.e., translated and rotated, until selected features of the layer coincide with the targets generated through the optical system. This next layer is then placed atop the previous layer. Finally, the layers are laminated to form the multilayer microelectronic circuit package.

25 Claims, 4 Drawing Sheets

FIG. 1

PROCESS FLOW CHART

1. PLACE PART ON CARRIER PLATE TO PRE-ALIGN
2. SLIDE-IN CARRIER PLATE ON RAILS UNTIL STOPS
3. PICK-UP PART WITH TOP VACUUM CHUCK
4. REMOVE CARRIER PLATE
5. MOVE CAMERAS/OBJ. LENS OVER LAY-UP FEATURES OF PART (X,Y-MOVEMENT), FOCUS AND CLAMP
6. DISPLAY FEATURES, ONE ON EACH MONITOR
7. GENERATE CROSSHAIR BOX AROUND DISPLAYED FEATURE ON EACH MONITOR
8. LOWER TOP VACUUM CHUCK AND PASS PART TO BOTTOM VACUUM CHUCK
9. MOVE-UP TOP VACUUM CHUCK TO HOME POSITION
10. PLACE NEXT PART ON CARRIER PLATE
11. SLIDE-IN CARRIER PLATE ON RAILS UNTIL STOPS
12. PICK-UP PART WITH TOP VACUUM CHUCK
13. REMOVE CARRIER PLATE
14. MOVE $X, Y, \Phi$ – TABLE UNTIL LAY-UP FEATURES LINE UP WITHIN THE CROSSHAIR BOXES OF THE PREVIOUS PART ACHIEVE BEST FIT (+/– 5 MICRON)
15. DISPENSE ADHESIVE ON TOP SURFACE OF PREVIOUS POSITIONED PART
16. LOWER TOP VACUUM CHUCK AND PLACE PART ON PREVIOUS POSITIONED PART
17. TO ALIGN ANY MORE PART(S) REPEAT STEPS 10-16

ALIGNMENT—REGISTRATION TOOL FOR FABRICATING MULTI-LAYER ELECTRONIC PACKAGES

FIELD OF THE INVENTION

This invention relates to multi-layer electronic circuit packages, including multilayer ceramic packages and multilayer reinforced polymeric packages, and especially multilayer microelectronic packages characterized by a complex network of programmed internal vias and internal signal planes. These layered structures require precise alignment between layers, and the yield thereof is sharply limited by the alignment. This invention relates especially to the optical alignment of the individual layers of multilayer packages and the optical registration between the layers prior to the lamination thereof. According to the method of the invention the necessity of drilling alignment holes or inserted alignment pins is obviated.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, and circuit boards, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" order package, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements. Fourth, the second level package provides for thermal management, i.e., heat dissipation.

In most applications, and especially personal computers, high performance workstations, mid range computers, and main frame computers, there is a third level of packaging. This is the board level package. The board contains connectors to accept a plurality of cards, circuitization to provide communication between the cards, I/O devices to provide external communication, and, frequently, sophisticated thermal management systems.

Many cards and boards, and especially those having a large number of I/O leads, and high wiring density, are multi-layer packages. Multi-layer packages have a plurality of signal planes, at least one power plane, and at least one ground plane.

The structural unit of the multi-layer package is the "core." The core is a composite structure of either ceramic or "pre-preg" between sheets of copper foil. "Pre-preg" is formed by impregnating fiber, for example, glass fiber or polytetrafluoroethylene fiber, with a resin, for example an epoxy resin or a polyimide resin, evaporating the solvents, and partially curing the resin to a "B-stage." A "core" is formed by laminating several plies of "pre-preg" between a pair of treated copper foil sheets. Lamination is carried out at elevated temperatures and pressures, to fuse and cure the resin.

The cores are "circuitized" by photolithographic processing of the copper foil. In the case of "subtractive" circuitization the "core" is drilled (for vias and through holes), seeded, and plated. Resist is then applied to the surface, and exposed and developed. The copper that is uncovered is then etched away, leaving behind the circuitization.

In the "additive" circuitization process, which is especially preferred for fine lines and high wiring densities, the core is drilled, and the copper then etched away. Thereafter photoresist is applied to the bare dielectric laminate, exposed in areas not desired for circuitry, and developed. In the development process the unexposed resist is removed, leaving channels in the resist layer. Copper circuitization is plated into these channels, for example, by electroless copper plating.

Multilayer microelectronic packages contain many interleaved layers of dielectric and circuitization. Superficially, the composite printed circuit package is fabricated by interleaving cores (including signal cores, signal/signal cores, power cores, power/power cores, and signal/power cores) with additional sheets of pre-preg, and surface circuitization. However, throughout the fabrication process the individual "cores" are registered, imaged, etched, drilled, registered again, aligned with other layers, and ultimately laminated to those other layers. It is only after all of the hole drilling, photolithography, plating and alignment/registration processes are successfully repeated within specification many times and lamination is completed that a multilayer composite is finally obtained.

Successful repetition of first registration, imaging, etching, drilling, second registration, and alignment, and lamination is required by the demands of denser circuitry, increased numbers of layers, finer circuit line tracks, narrower dielectric layers, narrower circuitization layers, and smaller diameter through holes and vias. These requirements translate into a requirement for highly accurate feature generation registration and lamination alignment and registration. Poor registration, whether at the feature generation stage or at the lamination stage, will consume the tolerance available for subsequent procedures, such as lay-up, and subsequent lamination, or registration.

One method of aligning layers of multi-layer printed circuit boards is by the use of so called "alignment holes" in the periphery of the layer. These holes are located and drilled as part of the same process as the vias and through holes, and are then aligned with alignment pins. Examples of registration utilizing alignment holes and pins are described most recently, for example, in U.S. Pat. No. 4,829,375 to Donald Alzmann, Michael Angelo, Paul Waldner, and Arthur Brady for *METHOD FOR PUNCHING IN PRINTED CIRCUIT BOARD LAMINATES AND RELATED APPARATUS AND ARTICLES OF MANUFACTURE*, U.S. Pat. No. 4,568,971 to Donald Alzmann, Michael Angelo, and Paul Waldner for *METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS*, and U.S. Pat. No. 4,481,533 to Donald Alzmann, Michael Angelo, and Paul Waldner for *METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS*, and M. Angelo, "Multilayer Registration Tooling—The Full Spectrum", *Printed Circuit Fabrication*, 10, (7), pp. 24–25, 27–30, and 33–34 (July 1987).

As described in these documents the registration of a layer in a multi-layer module is effected by drilling of "alignment holes" in the layers. Once these "alignment holes" are drilled, an "alignment post" is inserted in and extends outwardly from each "alignment hole" of the first layer. This "alignment post" is then used to align the both photomask art work and subsequent layers.

The aforementioned U.S. Pat. Nos. 4,829,375, 4,568,971 and 4,481,533 describe various means of locating holes, including the "alignment holes." U.S. Pat. No. 4,481,533 to Donald Alzmann, Michael Angelo, and Paul Waldner for *METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS*, describes apparatus, including an imaging system, for effecting operations at precise sites on the layers of a multilayer printed circuit board. The individual layers are held in place and imaged by the imaging system to detect reference markings on the layer. The imaging system also includes means for generating an index marking which is algorithmically related to the reference markings. These index markings are then used to position a tool for carrying out operations on the sheets. The operations include hole forming, for example "alignment holes."

U.S. Pat. No. 4,568,971 to Donald Alzmann, Michael Angelo, and Paul Waldner for *METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS* specifically describes method and apparatus for forming holes in the individual layers of multilayer printed circuit boards. The described method includes moving the layer to bring reference marks on the surface of a reference sheet into coincidence with index marks in an imaging system. After coincidence, the reference sheet is removed, and the sheet in which the hole is to punched is substituted for the reference sheet.

U.S. Pat. No. 4,829,375 to Donald Alzmann, Michael Angelo, Paul Waldner, and Arthur Brady for *METHOD FOR PUNCHING IN PRINTED CIRCUIT BOARD LAMINATES AND RELATED APPARATUS AND ARTICLES OF MANUFACTURE*, describes an optical coincidence method of locating and employing a tool to treat a substrate. In the described method a pattern and a target are located in prescribed relationship on the substrate. The substrate is then positioned on a carrier, and the location of the target is determined by means of an imaging system. The imaging system generates a location reference relative to the tool, a location of the target reference, and an error signal. The error signal then drives the movement of the target and the substrate into relationship with the location reference so that the substrate is in a prescribed relationship with the tool. The tool, now properly located, performs an operation on the substrate, for example, punching. The tool is disclosed to pierce the tooling configuration into the substrate. This hole forming tooling configuration can be used in subsequent production steps, described as lamination and drilling, to ensure layer-to-layer and image-to-drill registration.

To be noted is that these documents still require alignment holes and alignment posts to align and register one sheet of a multilayer package with another sheet of the package.

Other United States Patents describe optical systems for processing layers. For example, U.S. Pat. No. 4,203,132 to A. Schmitt, K. Schafer, and D. Utz for *METHOD OF ALIGNMENT* describes a method of aligning two parts by imaging at least two points on each of the parts to be aligned. The points have a separation that is less then the tolerance in positioning the parts. The points are then moved into prescribed position to align the two parts.

U.S. Pat. No. 4,404,741 to J. Lebet, L. Peterle, and F. Matthey-Doret for *DEVICE FOR ALIGNMENT OF A PART AND A SUBSTRATE FOR CARRYING THE PART* describes a mechanical assembly station for alignment of a part and a substrate by direct optical observation of features on the two bodies.

U.S. Pat. No. 4,494,139 to Y. Shima, S. Kashioka, T. Uno, and K. Suzuki for *AUTOMATIC ASSEMBLY SYSTEM* describes an alternative mechanical assembly station for alignment of a part and a substrate by direct optical observation of features on the two bodies, and the generation of an error function based upon the separation of body features.

U.S. Pat. No. 4,655,600 to Tanigawa for *ALIGNMENT METHOD* describes a method of alignment where "V" shaped marks are provided on the bodies to be aligned. Straight line reference marks are used to determine the positions of the "V" shaped marks, and to thereby generate an error signal that aligns the bodies.

U.S. Pat. No. 4,663,658 to M. Lanne, G. Pons, J. Petit, and F. Pauly for *PROCESS AND DEVICE FOR ASSISTING THE POSITIONING OF WORKPIECES BY SUPERPOSITIONING OF IMAGES* describes a positioning method and system where an image of the workpiece is displayed, along with a test pattern, on the screen of an imaging system. According to Lanne et al the workpiece has an image of this test pattern on its surface. The workpiece is moved until the virtual test pattern is brought into coincidence with the actual test pattern on the surface of the workpiece.

U.S. Pat. No. 4,680,627 for A. Sase, T. Nagata, M. Fukunaga, and Y. Satomi for APPARATUS FOR CHECKING PATTERNS ON PRINTED CIRCUIT BOARDS describes an alignment system that matches alignment marks on the workpieces.

U.S. Pat. No. 4,731,923 to H. Yagi, S. Tando, and T. Nakamura for APPARATUS AND METHOD FOR MOUNTING CIRCUIT ELEMENT ON PRINTED CIRCUIT BOARD describes an alignment system that align features of the workpieces with each other.

The above described United States Patents all describe the use of a feature on one workpiece to align that workpiece with another workpiece. However, for registration and alignment of successive layers in a multilayer microelectronic package, layer to layer alignment of successive features builds up an alignment error that is the statistical sum of the individual errors on each layer. This results in a severe alignment-limited yield.

OBJECTS OF THE INVENTION

The primary object of the invention is to provide a reproducible registration method for the lamination of cores of a multilayer microelectronic package.

It is a further object of the invention to provide a registration method that does not rely on matching pins and holes to obtain lamination registration.

It is a still further object of the invention to provide an optical method of lamination registration.

SUMMARY OF THE INVENTION

The deficiencies of the prior art are obviated and the objects of the invention are attained by the optical registration alignment method described herein.

These objects of the invention are attained, and the reliance upon both (1) alignment holes and pins, and (2) individual features on successive layers is obviated by the optical coincidence method of the invention. The invention includes a method of forming a multilayer microelectronic circuit package. This method utilizes the coincidence of surface features on a layer with a stored optical target derived from surface features of a subsequent layer.

In carrying out the process of the invention a first layer of the package is positioned in an assembly station. This first layer has surface features, such as through holes, vias, circuitization, alignment fiducials, combinations and patterns thereof, and the like. These features are utilized as optical landmarks for aligning subsequent layers of the package. In carrying out the method of the invention specific ones of the surface features are positioned in proximity to an optical system. This optical system is adapted for imaging these surface features.

The imaging system images selected surface features on the surface of the layer and generates targets. These targets, which may be geometric shapes or patterns are then used for positioning at least a subsequent layer. This subsequent layer is positioned until selected features on its surface coincide with the targets generated through the optical system. Upon such coincidence the subsequent layer is placed atop the previous layer.

THE FIGURES

Specific details of the invention and of the method thereof are illustrated in the FIGURES.

DETAILED DESCRIPTION OF THE INVENTION

Figure 1:
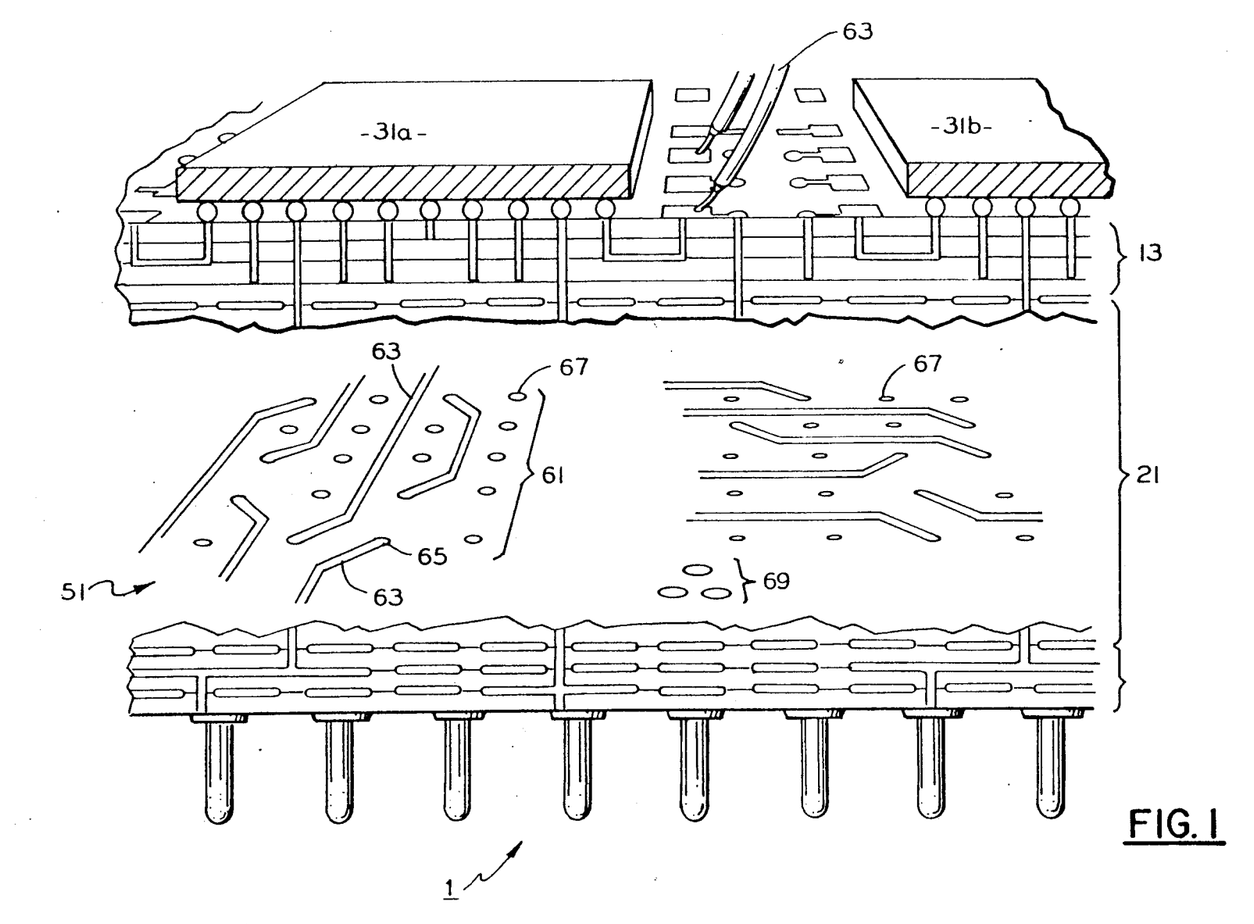
FIG. 1 is a perspective, partial cutaway view of a multi-layer, multi-chip module.

A multi-layer, multi-chip module (1) is shown in partial cutaway, perspective view in FIG. 1. Microminiaturization in device and integrated circuit fabrication has led to the integration of many thousands of devices in a single integrated circuit chip (31a,31b). As predicted by Rent's Rule, there has been a corresponding increase in the number of chip I/O's (33a,33b) to be packaged. Packaging chips (31a,31b) with a large number of I/O's (33a,33b) per chip (31a,31b) in the traditional hierarchical manner is detrimental to machine performance. A solution to this problem is the use of a multi-chip module (1).

A multi-chip module (1) includes a dense multilayer package (11). The package (11) has to be as highly integrated as the integrated circuit chip (31a,31b) itself in order to minimize the interconnect length. A multi-chip module (1) also eliminates a level of packaging, so that the top layer (13) of the package (11) has to match the I/O (33a,33b) footprints of the chips (31a,31b) themselves. For CMOS and biMOS chips (31a,31b) the I/O (33a,33b) footprint is formed of 100 micron pads at a center-to-center pitch of 250 microns.

The pitch of CMOS and bi-MOS chips (31a,31b) requires parallel processing of the package (11). That is, the registatration and lamination of several planes (51) is done simultaneously.

The process of the invention and apparatus useful in the practice of the invention are illustrated in the FIGURES. The process of the invention for forming a multilayer microelectronic circuit package is set forth in the flow chart of FIG. 2.

Figure 2:
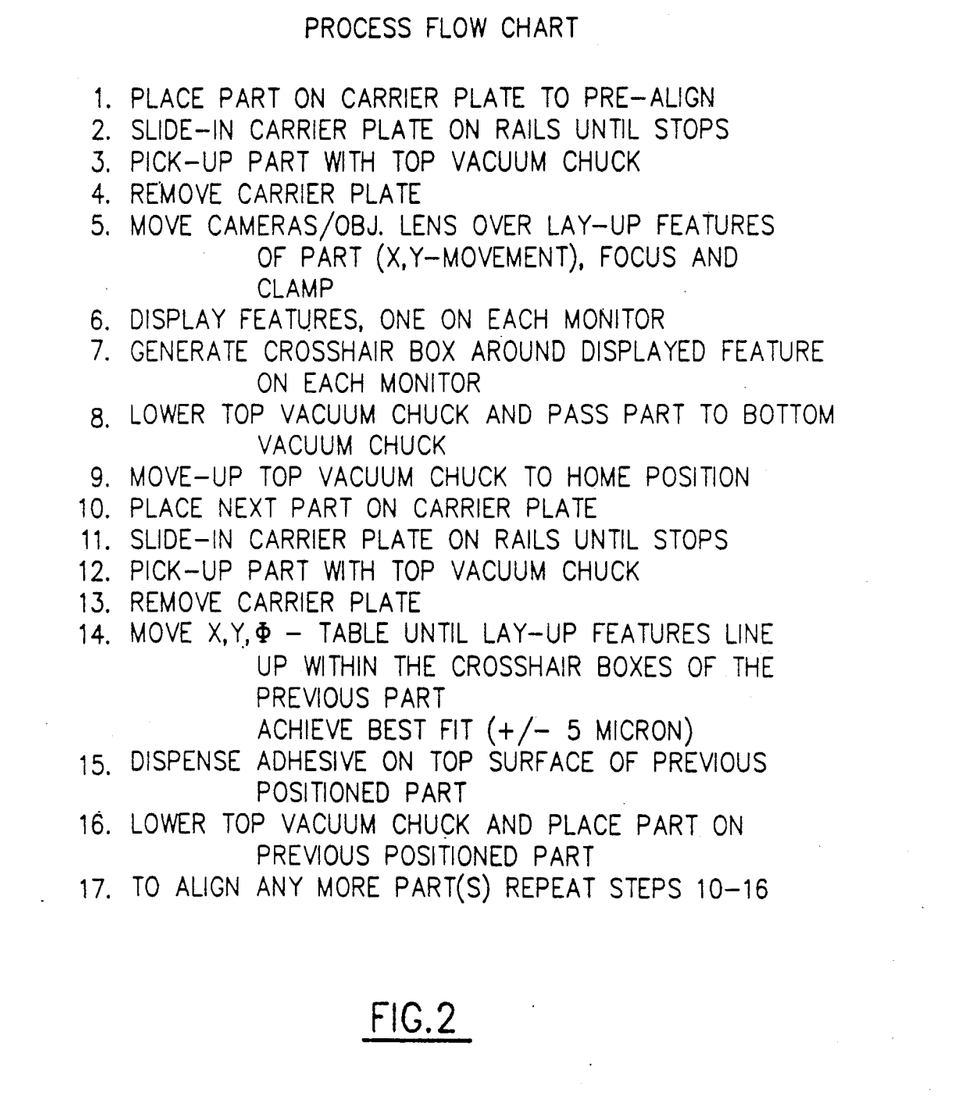
FIG. 2 is a flow chart of one method of the invention.

As illustrated in FIG. 2, the first step in the practice of the invention is the alignment of the first layer (51) of the package (11) in a precision assembly station (101), in proximity to an optical system, as imaging system (201). The layer (51) has features (61) thereon, as circuitization patterns, through holes, vias, and alignment features. These features (61) are moved into proximity to the optical system (201), which is adapted for imaging a surface (60) of the layer (51), and especially the features (61) thereon.

Figure 3:
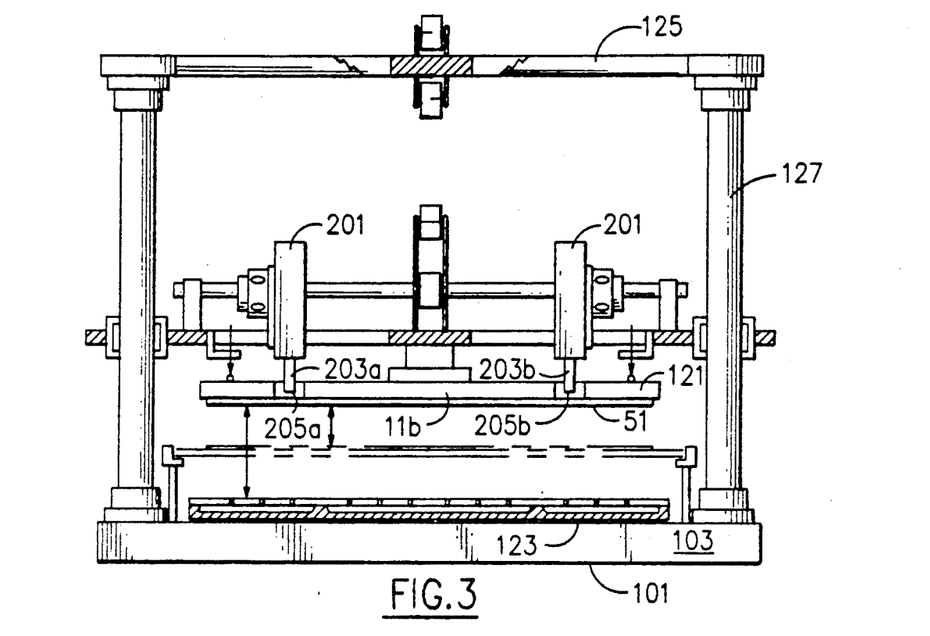
FIG. 3 is a front elevation view of a precision lay up assembly station useful in carrying out the method of the invention.
Figure 4:
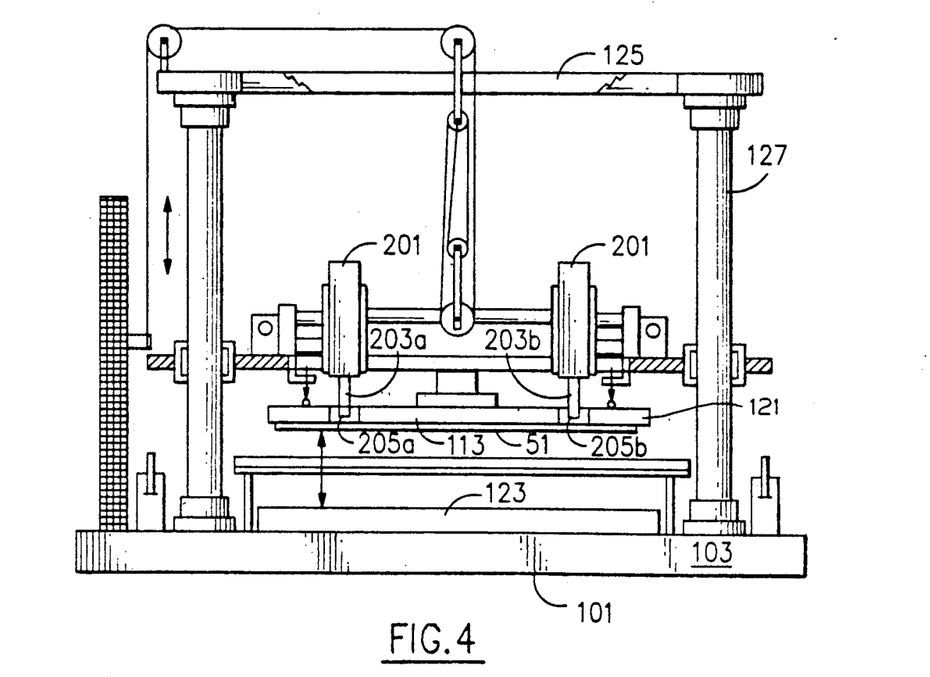
FIG. 4 is a side elevation of the precision lay up assembly station of FIG. 3.

This is shown with respect to the precision assembly station of FIGS. 3 and 4, where the first layer (51) of the multi-layer package (11) is placed on a carrier plate (111) of the precision assembly station (101) for pre-alignment of the first layer (51). The carrier plate (111) is then slid along rails (112) into position under a top vacuum chuck means (121) within the precision assembly station (101). The top vacuum chuck means (121) then lifts the layer (51) off of the carrier plate (111). The carrier plate (111) is then moved, for example, back to its starting position (111a).

After positioning of the first layer (51) the optical system (201) images selected ones of the features (61) on the surface (60) of the first layer (51), and generates targets (71) through said optical system (201) around the selected ones of the features (61). These targets (71) may be in the form of circles, ovals, squares, rectangles, cross-hairs, verniers, or the like.

The optical system (201) is then moved over the layer (51) and focussed on selected features (61) of the layer (51). The selected features (51) are displayed on imaging means (203) of the optical system (201). The imaging means (203) generate a target (71), as cross hairs or boxes (71) around the selected features (61). After the targets (71) are generated by the imaging means (203), the top vacuum chuck means (121) lowers the layer (51) to bottom vacuum chuck means (123). The top vacuum chuck means (121) then returns to its starting position.

The generated targets (71) are then used to position the next layer (53) of the package (11). Specifically, the next layer (53) of the circuit package (11) is positioned into proximity with the optical system (201), and moved, for example in the X, Y, and THETA directions until selected features (61) thereof coincide with the targets (71) generated through the optical system (201). After translational and rotational positioning the subsequent layer (53) is properly aligned, the layer (53) is placed atop the previous layer (51), for example with a temporary adhesive therebetween.

The second or subsequent layer (53) is slid under the top vacuum chuck means (121) by carrier plate means (111), and picked up by the top vacuum chuck means (121). The carrier means (121) is then withdrawn. The second layer (53) is positioned on a translatable and rotatable table means (113) by the vacuum chuck means (121). This translatable (X and Y axis translational movement) and rotatable (PHI translation) is referred to herein as the X—Y—PHI table means (113). The X—Y—PHI table means (113) moves, i.e., in translation and rotation, until selected features (61) on the subsequent layer (53) line up with the targets (71) generated by the imaging system (203).

Meanwhile, a thin layer of adhesive, as polymeric adhesive, is dispensed along the top surface of the previously positioned layer (51). The top vacuum chuck means (121) is then lowered and the subsequent layer (53) is positioned atop the previously positioned layer (51) with the adhesive therebetween. This process is repeated until all of the layers making up the multi-layer electronic circuit package are aligned and registered.

A layer, as first layer (51) or subsequent layer (53) may actually be a subcomposite of dielectric layers with circuitization, as signal circuitization, or power circuitization, or both, interposed therebetween. Moreover, the dielectric may be organic, reinforced organic, or ceramic.

A precision assembly station (101) useful in carrying out the process of the invention, as described hereinabove, is shown with particular detail in FIGS. 3 and 4, and as part of an integrated system with the optical system 201 and imaging system (203) in FIG. 6. The precision assembly system (101) is on a heavy base plate (103) with a bottom vacuum chuck means (123) mounted thereon. This is part of a rigid structure with a top plate (125) and supports (127). Extending movably downward from the top plate (125) on a pulley block (129) is a top vacuum chuck means (121) and a table (113). As described hereinabove, the table (113) is capable of X and Y axis translation and PHI axis rotation.

Also mounted with the table (113) and top vacuum chuck means (121) is the optical system (201), which includes an imaging system (203) having at least two cameras (204a,204b), with objective lenses (205a,205b). The objective lenses (205a,205b) view the layer, as the first layer (51) or a subsequent layer (53) through apertures (206a,206b) in the top vacuum chuck means (121), and are capable of X axis movement, Y axis movement, and PHI axis rotation.

FIG. 4 shows an individual layer (51) of the multi-layer package (11). The layer has an active area (60), i.e, a circuitized layer. Outside the active area (60) are conventional alignment holes (63) representative of the prior art and the optical alignment marks (65) of the instant invention. To be noted is that the alignment holes, which are representative of the prior art, are elliptical in shape and given to deformation and distention during processing. This leads to inaccurate registration.

Figures 5, 6, 7:
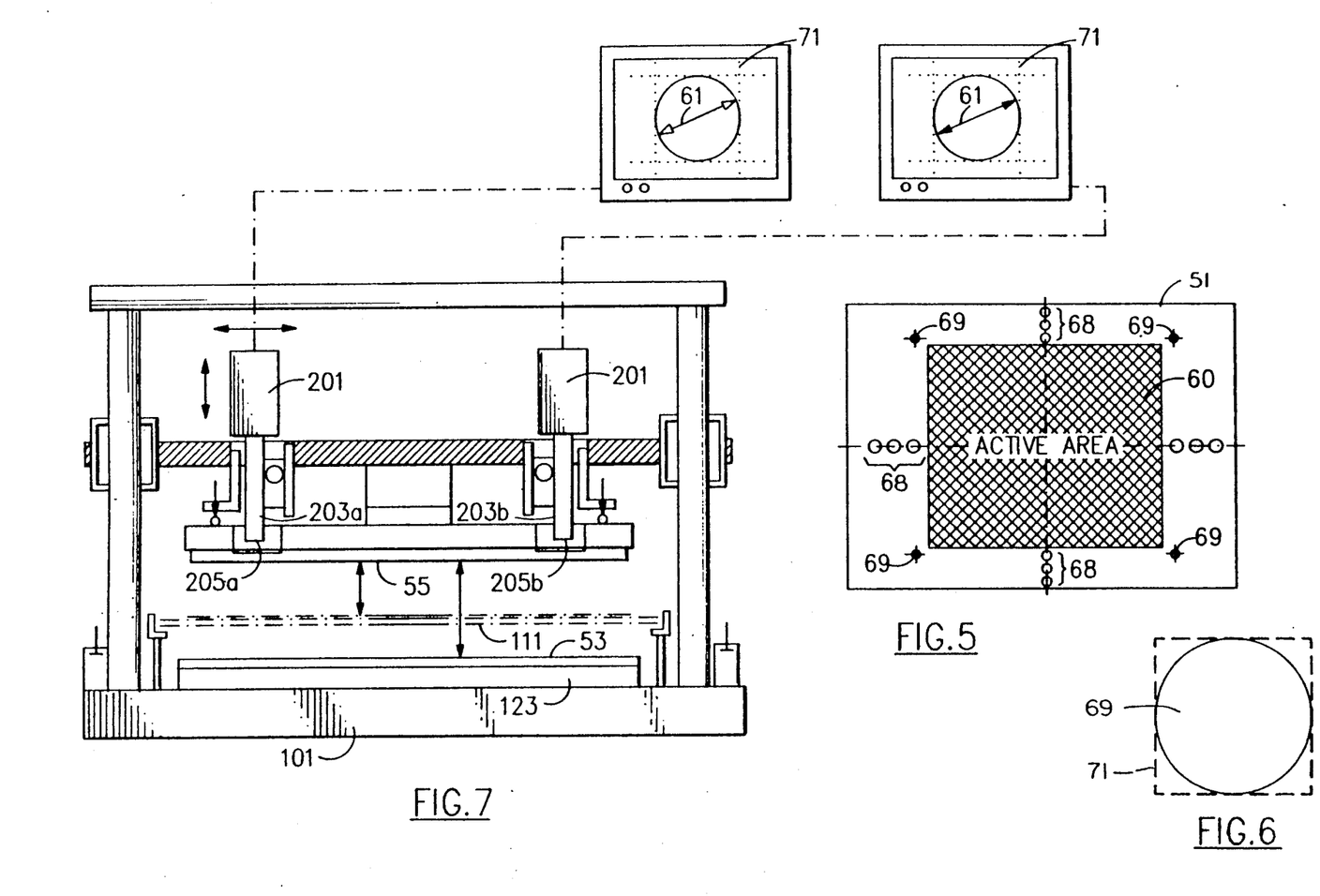
FIG. 5 is a plan view of a layer of the multi-layer package, showing the optical lay up features of the invention and the pin lay up features.
FIG. 6 is a detailed view of the optical lay up features shown in FIG. 5, with the coincident targets generated by the optical system.
FIG. 7 is a partial schematic view of the registration system, including a front elevation view of the precision lay up assembly station shown in FIGS. 3 and 4, a front elevation of the layer shown in FIG. 5, the imaging system, and the image of the optical lay up features shown in FIG. 6, with the optically superimposed, coincident target.

The optical lay up features (65) of the invention are shown with specificity in FIG. 6. As illustrated in the FIGURE, the optical lay up features (65) may be circular. Alternatively, the optical lay up features (65) may be elliptical, triangular, square, rectangular, or higher order polygons. They may also be cross hairs, or even verniers.

The integration of the layers (51,53), the precision assembly station (101), and the optical system (201), including the imaging system (203), are shown in FIG. 7. FIG. 7 is a partial schematic view of the registration system, including a front elevation view of the precision lay up assembly station (101) shown in FIGS. 3 and 4, a front elevation of the layer (51) shown in FIG. 5, the optical system (201), including the imaging system (203), and the image of the optical lay up feature (65) shown in FIG. 6, with the optically superimposed, coincident target (71).

According to a particularly preferred embodiment of the invention, a first layer (51) is placed on a carrier plate means (111) and moved into the precision assembly station (101). The carrier plate means (111) may be magnetized to keep the layer (51) flat. The individual layers (53) are then sequentially individually delivered to the top vacuum chuck means (121) by the pulley block (129) or other elevator means. After delivery of an individual layer (51) to the top vacuum chuck means (121) the carrier plate means (111) can be withdrawn from the precision assembly station (101).

The imaging system (203), including two or more cameras (204a, 204b) is moved over the layer (51 or 53) and its lay up physical features (61). The cameras (204a, 204b) focus on the individual lay up physical features (61), and an appropriate target (71) is generated by the optical system (203) in coincidence with or around the selected surface lay up features (61). After generating the targets (71), the top vacuum chuck means (121) is lowered, transferring the layer (51 or 53) to the bottom vacuum chuck (123).

Subsequently, the next layer (53) is picked up, and delivered to the top vacuum chuck means (121) by the pulley block (129) or other elevator means. After delivery of this subsequent layer (53) to the top vacuum chuck means (121) the carrier plate means (111) can be again withdrawn from the precision assembly station (101). The imaging system (203), including the two or more cameras (204a, 204b) is again moved over the layer, this time the subsequent layer (53), and the lay up features (61) are again imaged. The subsequent layer (53) is moved, that is translated in the X and Y directions and rotated in the PHI axis until the target (71) previously generated by the optical system (203) with respect to the prior layer (51) is in coincidence with or around the selected surface lay up features (61) of this subsequent layer (53).

A small amount of adhesive, not shown, is applied to the previously stacked, prior layer (51). This adhesive prevents movement after stacking and prior to lamination. After alignment and stacking of the layers has been completed, the composite is transferred to a lamination press, not shown, for joining. The method of the invention results in a fit of +/−5 microns or finer.

While the invention has been described with respect to certain preferred embodiments and exemplifications thereof, it is not to be limited thereby, but is defined solely by the claims appended hereto.

We claim:

1. A method of forming a multilayer microelectronic circuit package comprising the steps of:
   providing a first layer thereof having features thereon in proximity to an optical system adapted for imaging a surface of the layer;
   imaging features on the surface of the first layer with said optical system;
   generating targets through said optical system with respect to selected ones of said features;
   storing the targets generated from the selected features of the layer;
   placing a next layer of the circuit package into proximity with the optical system;
   moving the said next layer until selected features thereof coincide with the stored targets generated from the surface features of the first layer through the optical system; and
   placing the said next layer atop the first layer.

2. The method of claim 1 comprising generating geometric shape targets through said optical system.

3. The method of claim 2 comprising generating elliptical targets through said optical system.

4. The method of claim 2 comprising generating cross hair boxes through said optical system.

5. The method of claim 1 comprising generating target patterns through said optical system.

6. The method of claim 1 wherein the features on the layer are chosen from the group consisting of circles, ellipses, polygons, cross-hairs, and verniers.

7. The method of claim 1 comprising imaging the features through an optical system comprising at least one camera.

8. The method of claim 7 comprising imaging the features through an optical system comprising at two cameras.

9. The method of claim 1 comprising aligning the layers to within +/−5 microns.

10. The method of claim 1 placing the first layer on a carrier plate means, and sliding the carrier plate means under the optical system.

11. The method of claim 10 comprising picking up the first layer with a top vacuum chuck means.

12. The method of claim 11 comprising thereafter removing the carrier plate means.

13. The method of claim 11 comprising thereafter moving the optical system over lay up features of the layer, and clamping the layer.

14. The method of claim 13 comprising displaying the features of the layer.

15. The method of claim 13 comprising lowering the top vacuum chuck means and passing the first layer to a bottom vacuum chuck means.

16. The method of claim 15 comprising thereafter returning the top vacuum chuck means to its original position.

17. The method of claim 15 comprising placing a subsequent layer on the carrier plate means and sliding the carrier plate means and subsequent layer under the optical system.

18. The method of claim 17 comprising picking up the subsequent layer with the top vacuum chuck means.

19. The method of claim 18 comprising thereafter removing the carrier plate means.

20. The method of claim 18 comprising thereafter moving the subsequent layer to align lay up features thereof with targets generated from features of the first layer.

21. The method of claim 20 comprising thereafter adhering the layers.

22. A method of forming a multilayer microelectronic circuit package comprising the steps of:
   providing a first layer thereof having features thereon on carrier plate means;
   moving said layer on said carrier plate means into proximity to an optical system adapted for imaging a surface of the layer and picking up the first layer with a top vacuum chuck means to bring the first layer into closer proximity to the optical system;
   positioning said optical system with respect to said features on the surface of the first layer to image selected features with said optical system;
   generating targets through said optical system with respect to the selected ones of said features;
   storing the targets generated from the selected features of the layer;
   lowering the top vacuum chuck means and passing the imaged layer to a bottom vacuum chuck means;
   placing a next layer of the circuit package onto said carrier plate means and moving said carrier plate means into proximity with the optical system;
   picking up the next layer of the circuit package with the top vacuum chuck means;
   moving the said next layer until selected features thereof coincide with the stored targets generated from surface features of a prior layer through the optical system; and
   lowering the top vacuum chuck means to place the said next layer atop the first layer at an alignment within +/−5 microns.

23. An optical alignment apparatus for aligning and laminating layers of a multilayer microelectronic circuit package comprising:
   carrier plate means for carrying individual layers of the multilayer microelectronic circuit package;

optical system means for (i) imaging selected features of individual layers, (ii) generating targets with respect to said selected features, (iii) storing optical target features generated from surface features of a prior layer, and (iv) superimposing said generated targets over selected features of subsequent layers of said multilayer microelectronic circuit packages;

means for moving said layer on said carrier plate means into proximity to the optical system;

means for picking up the first layer and bringing the first layer into closer proximity to the optical system;

means for positioning said optical system with respect to said features on the surface of the first layer to thereby allow the optical system to image selected features of the first layer;

means for lowering imaged layer and passing the imaged layer to a bottom retaining means;

means for moving a next layer until selected features thereof coincide with the targets generated through the optical system; and means for lowering the said layer and placing the said layer atop the first layer.

24. The optical alignment apparatus of claim 23 wherein the means for picking up the first layer and bringing the first layer into closer proximity to the optical system comprises vacuum chuck means.

25. The optical alignment apparatus of claim 23 wherein the bottom retaining means comprises vacuum chuck means.

* * * * *